United States Patent [19]

Vasudev

[11] Patent Number: 4,748,485
[45] Date of Patent: May 31, 1988

[54] OPPOSED DUAL-GATE HYBRID STRUCTURE FOR THREE-DIMENSIONAL INTEGRATED CIRCUITS

[75] Inventor: Prahalad K. Vasudev, Santa Monica, Calif.

[73] Assignee: Hughes Aircraft Company, Los Angeles, Calif.

[21] Appl. No.: 60,935

[22] Filed: Jun. 9, 1987

Related U.S. Application Data

[63] Continuation of Ser. No. 714,286, Mar. 21, 1985, abandoned.

[51] Int. Cl.$^4$ .............................................. H01L 29/78
[52] U.S. Cl. .............................. 357/23.7; 357/23.14; 357/4
[58] Field of Search ..................... 357/23.7, 23.14, 4

[56] References Cited

U.S. PATENT DOCUMENTS

| | | | |
|---|---|---|---|
| 4,272,880 | 6/1981 | Pashley | 357/23.7 |
| 4,570,175 | 2/1986 | Miyao et al. | 357/23.7 |

FOREIGN PATENT DOCUMENTS

| | | | |
|---|---|---|---|
| 56-88354 | 7/1981 | Japan | 357/23.7 |
| 56192129 | 6/1983 | Japan | 357/4 |
| 57-37661 | 9/1983 | Japan | 357/23.7 |
| 58-175853 | 10/1983 | Japan | 357/23.7 |
| 59-182571 | 10/1984 | Japan | 357/23.14 |

*Primary Examiner*—Andrew J. James
*Assistant Examiner*—Mark Prenty
*Attorney, Agent, or Firm*—Terje Gudmestad; Paul M. Coble; A. W. Karambelas

[57] ABSTRACT

A three-dimensional integrated circuit structure utilizing a hybridization of silicon-on-insulator and silicon-on-sapphire technologies is disclosed, wherein a buried doped epitaxial silicon layer, insulated from a gated semiconductor device by a buried insulating layer, biases the gate region of the overlying semiconductor device, thereby providing a second gate positionally opposed to the conventional first gate of the semiconductor device. The second gate (or backgate) is utilized to draw undesired charge carriers from its overlying insulating layer, thereby avoiding the undesirable effects of the presence of such excess charge carriers, which typically may be induced by external radiation. The selectable backgating feature is fully compatible with existing integrated circuit fabrication technology, and may be utilized to provide a single backgate for all overlying semiconductor devices, or individual backgates for one or groups of semiconductor devices in island-etched structures.

11 Claims, 2 Drawing Sheets

OPPOSED DUAL-GATE HYBRID STRUCTURE FOR THREE-DIMENSIONAL INTEGRATED CIRCUITS

This application is a continuation of application Ser. No. 714,286, filed Mar. 21, 1985, and now abandoned.

BACKGROUND OF THE INVENTION

1. Field of the Invention

This invention relates to semiconductor devices, and, more particularly, to a backgated hybrid construction particularly useful in suppressing the effect of undesirable charge carriers in gated semiconductor devices.

2. Description of Related Art

Gated semiconductor devices are important components of many large scale and very large scale integrated circuits such as microprocessors and semiconductor memories. They are also becoming increasingly important in power control devices, as the semiconductor technology of handling high voltages and currents improves.

The most important of such gated semiconductor devices are MOSFETs (metal-oxide-semiconductor field effect transistors) and related devices. In a conventional MOSFET, a gate region separates a source region from a drain region, and under proper conditions a conductive path is formed through the gate region so that a current can flow from the source region to the drain region. The current flows by a conducting channel produced through the gate region, and the conductance of the channel can be modulated by varying the gate voltage. Large numbers of MOSFETs of various types may be fabricated together on a single substrate in an interconnected fashion to perform complex logic, memory and control functions in miniature devices. The size and scale of MOSFETs has been continually reduced as semiconductor technology has progressed over the years, to a size of about 1-5 micrometers, so that it is possible to place on the order of 100,000 to 1,000,000 components on a single substrate chip, and even greater numbers of devices on a single chip are predicted for the future.

MOSFETs and other gated devices are typically fabricated by placing the source, drain, and gate regions on a substrate such as an insulator, which insulates individual components from their neighbors in an integrated circuit. The thicknesses of the gate region and the conducting channel can be very small, on the order of 0.1 micrometers, and therefore the presence of even relatively small numbers of undesirable, stray charge carriers can significantly affect the operation of the spatial distribution of the gated device. That is, the stray charge carriers distort the gating voltage as applied to the conducting channel, thereby changing the operating characteristics or even causing failure of the component if a sufficiently great number of stray charge carriers is introduced.

Some stray charge carriers are inherently present in most gated semiconductor devices due to the presence of impurities and electrical interactions at the interfaces between regions of different composition. Continuing improvements in device fabrication techniques serve to reduce the effect of such inherent charge carriers.

On the other hand, excessive amounts of undesired charge carriers may be introduced into an integrated circuit either inadvertently in the operating environment such as space, intentionally by one who seeks to disrupt the operation of the integrated circuit device or intentionally during processing steps accomplished by electron beams or x-ray plasmas. There have been, and continue to be, extensive efforts to develop techniques for resisting disruption of integrated circuit devices as a result of the introduction of high concentrations of charge carriers into the devices, but such approaches have not yet met with complete success. Thus, there exists a need for nullifying the effect of internally or externally introduced stray charge carriers in such electronic circuits.

It is well-known to bias the substrate of a gated semiconductor device. However, when the substrate is a sapphire wafer on the order of 0.25 millimeters thick, very high biasing voltages such as on the order of 10 kilovolts must be applied to have a significant effect on the stray charge carriers which may be present adjacent the gate of the component fabricated on the top of the substrate. Such high voltages are impractical in many applications, and in addition a single high substrate biasing voltage cannot be varied or changed in polarity to provide different biasing voltages for single or grouped semiconductor devices. While such substrate biasing does tend to remove some of the undesirable stray charge carriers, the presently known biasing technology is not feasible for use in many circuit elements to achieve control of the excess charge carriers.

Therefore, there exists a need for a technique whereby a gated semiconductor device may be fabricated on an insulating substrate in such a way that stray charge carriers in the device may be controlled, and preferably removed. The approach should allow retention of conventional advantages of thick, structural insulating substrates and also be fully compatable with conventional semiconductor fabrication technologies, wherein device structures are built upwardly from a structural substrate. The present invention fulfills this need, and further provides related advantages.

SUMMARY OF THE INVENTION

The article and process of the present invention provide a circuit component wherein internally and externally produced stray charge carriers may be drawn from the gate region of a gated semiconductor device by a second, buried gating structure oppositely disposed to the conventional gate of the device. The second gate may be accessed from the front side of the three-dimensional structure, and fabrication of the device is fully compatible with existing fabrication technologies for silicon devices. The invention therefore provides an electrical technique for hardening a gated semiconductor device against the effects of externally introduced radiation that produces excess charge carriers adjacent the gate region, which otherwise might be sufficient to incapacitate the device.

In accordance with the invention, an article for use in an integrated circuit comprises an insulating substrate; a backgate electrode epitaxially related to the insulating substrate, the backgate electrode having an external backgate contact for electrically biasing the backgate electrode; an insulating overlay epitaxially related to the backgate electrode; and a gated semiconductor device overlying the insulating overlay, whereby a biasing voltage applied to the backgate contact biases the backgate electrode to act as a buried gate for the semiconductor device. The insulating substrate is typically sapphire or spinel, the backgate electrode is typically epitaxial silicon heavily doped with a P+ or N+ dopant such as boron or phosphorus, and the insulating overlay is typically silicon doped with oxygen or nitrogen to convert the overlay to $SiO_2$ or $Si_3N_4$. The gated semiconductor device is preferably a MOSFET or interrelated array of MOSFETs combined to achieve specific functions.

In a preferred approach, the backgate electrode and the insulating overlay are formed in a single piece of silicon which was previously epitaxially established in an epitaxial relationship on the insulating substrate, and different sublayers of the epitaxial silicon are doped with different dopants to produce the respective layers. Such an article comprises an insulating substrate; a first silicon layer epitaxially related to the substrate, the first silicon layer having two different sublayers contained therein, including a backgate electrode sublayer adjacent the substrate, the backgate electrode sublayer being doped with a dopant selected from the group consisting of a P+ and N+ silicon dopant, so that the backgate electrode is electrically conducting; and an insulating sublayer overlying the backgate electrode sublayer. A gated semiconductor device may then be fabricated in the silicon region over the insulating sublayer. Again, the preferred dopants for the backgate electrode are boron or phosphorus, and the preferred structure for the insulating sublayer is $SiO_2$ or $Si_3N_4$. This preferred device operates in a manner substantially similar to that previously described, wherein the backgate electrode may be biased to collect the charge carriers from the gate region of the semiconductor device adjacent the insulating sublayer. In both of these approaches, it is possible to fabricate a single island semiconductor device or groups of island-isolated semiconductor devices, each having its own individually biased backgate electrode, by utilizing conventional fabrication and etch techniques.

In another aspect of the invention, a process for fabricating such an article comprises the steps of providing an insulator substrate; epitaxially depositing on the substrate a first layer of silicon; implanting a first dopant species in the portion of the first layer of silicon adjacent the substrate to form a first doped layer, the first dopant being selected from the group consisting of a P+ and N+ dopant of silicon; annealing the implanted structure a first time to transform the first doped layer to a backgate electrode sublayer; implanting a second dopant species in the portion of the first layer of silicon adjacent to and overlying the backgate electrode sublayer to form a second doped layer, the second dopant being selected from the group consisting of oxygen and nitrogen; annealing the implanted structure a second time to transform the second doped layer to an insulating sublayer selected from the group consisting of $SiO_2$ and $Si_3N_4$; and fabricating a gated semiconductor device overlying the insulated sublayer, whereby the backgate electrode sublayer and the insulating sublayer cooperate to act as a buried gate for the gated semiconductor device. This process is fully compatible with other semiconductor device fabrication technologies in both the materials used and the fabrication process parameters employed. In a preferred process, the substrate is sapphire or spinel, the first dopant is boron or phosphorus, the first implanted layer is about 0.1 micrometers thick, the second implanted layer is about 0.2 micrometers thick, and the first annealing and second annealing are conducted at about 850° C. and 1100° C., respectively.

The article and process of the present invention constitute a hybridization of two major technologies, silicon-on-insulator (SOI) and silicon-on-sapphire (SOS), and incorporate the advantages of each while eliminating their drawbacks. The sapphire substrate forms a strong structural element underlying the entire chip, and allows the structural definition of the various electrical components by etching. On the other hand, the potentially uncontrollable substrate bias requirement of silicon-on-sapphire devices is eliminated by means of the inclusion of the front-addressable backgate electrode layer between the sapphire substrate and the insulating overlay. In a more subtle aspect, the interfacial charge, autodoping, and high density of crystal defects normally present at the silicon-sapphire interface are eliminated by interposing the more nearly perfect silicon-$SiO_2$ or -$Si_3N_4$ interface between the gated semiconductor device and the sapphire or spinel structural substrate.

Other features and advantages of the present invention will become apparent from the following more detailed description, taken in conjunction with the accompanying drawings, which illustrate, by way of example, the principles of the invention.

DESCRIPTION OF THE PREFERRED EMBODIMENTS

Figure 1:
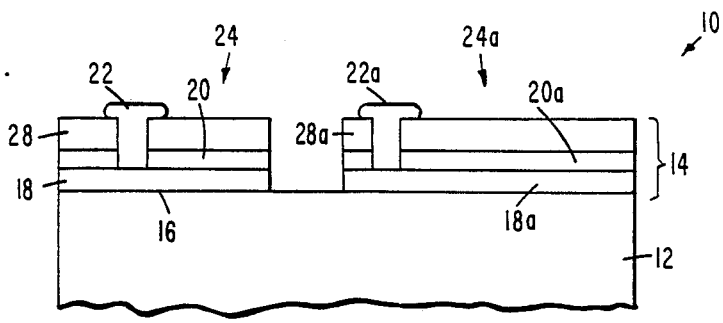
FIG. 1 is a side sectional view of a backgated hybrid wafer.
Figure 2:
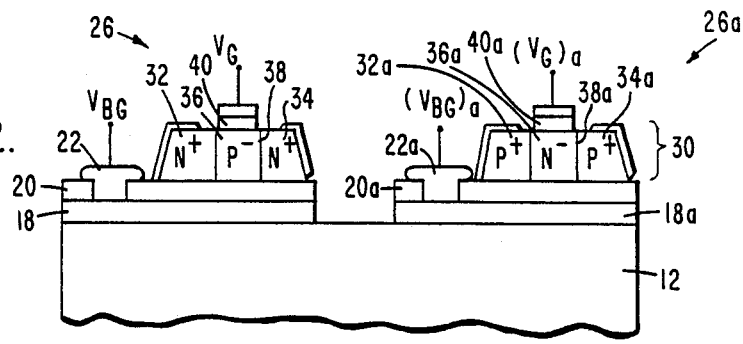
FIG. 2 is a side sectional view of a backgated wafer with N-channel and P-channel MOS devices overlayed thereon and having selectable bias contacts.

As illustrated in FIGS. 1 and 2, the present invention is concerned with a wafer base 10, upon which conventional gated semiconductor devices may be fabricated. The term "wafer base" refers to an article having an insulating substrate, a backgate electrode and an insulating overlay, and a single crystal silicon layer, in a three-dimensional stacked structure without semiconductor devices having yet been fabricated upon this base, as shown in FIG. 1. The present invention also extends to the wafer bases having devices fabricated thereupon, such as the dual gated MOS device illustrated in FIG. 2.

In accordance with the invention, and as illustrated in FIG. 1, the wafer base 10 includes a substrate 12 formed of a structural insulating material such as sapphire or spinel. The substrate 12 is preferably in a form commonly used for structural substrates in integrated circuit devices, and is typically available as a flat plate about 0.25 to 0.40 millimeters thick. The substrate 12 preferably has a surface crystallographic orientation of within 1° of ($1\bar{1}02$) (hexagonal Miller indices notation), since this crystallographic orientation allows epitaxial deposition of a silicon layer having a crystallographic orientation of (100) (cubic Miller indices notation). It is generally preferred that epitaxially grown silicon layers used in MOS device fabrication have this crystallographic orientation.

A silicon epitaxial layer 14, preferably about 0.5 to about 0.6 micrometers thick, overlies the substrate 12, in an epitaxial relation thereto. That is, specific crystallographic planes of the substrate 12 and the silicon layer 14 are matched together to provide an interface 16 having a minimal defect concentration. As indicated previously, it has been well-established in the art that an acceptable epitaxial relationship exists when the ($1\bar{1}02$) sapphire is epitaxially matched with a (100) silicon crystallographic face. Inasmuch as other overlays separate this interface from the active semiconductor device, this epitaxial matching is not as critical as in conventional SOS devices. Nevertheless, in the preferred embodiment, the (100) silicon face is epitaxially related to the ($1\bar{1}02$) sapphire face. Fortunately, this epitaxial relationship is easily achieved in the preferred fabrication process, to be subsequently described.

The region of the silicon epitaxial layer 14 immediately adjacent the interface 16 with the substrate 12 is preferably a doped silicon backgate electrode layer 18. The backgate electrode 18 is preferably about 0.1 micrometers in thickness, although this thickness is not critical and may vary somewhat. The backgate electrode 18 is doped with either a P+ or an N+ silicon dopant, such as the P+ dopant boron or the N+ dopant phosphorus. The concentration of the dopant is sufficiently great to allow transport of charge carriers under an applied biasing potential, lowering the resistivity of the gate contact and electrode material. Typical P+ boron and N+ phosphorus concentrations are about 3 to $5 \times 10^{20}$ carriers/cubic centimeter.

Overlaying the backgate electrode 18 is an insulating overlay 20. The insulating overlay 20 is preferably a layer of $SiO_2$ or $Si_3N_4$ about 0.2 to 0.3 micrometers thick, which provides the advantages of the insulator portion of a typical SOI structure. In the preferred fabrication approach, the insulating layer is formed by a heavy implantation dosage of oxygen or nitrogen into the silicon epitaxial layer 14, followed by an annealing treatment to convert the doped region into $SiO_2$ or $Si_3N_4$ insulator.

As indicated, the preferred approach to fabricating the wafer base 10 is through multiple ion implantation into the silicon epitaxial layer 14. This preferred fabrication approach will be described in more detail subsequently. However, it is emphasized that the structure and advantages of the present invention are not limited to any particular fabrication approach, but instead derive from the structural relationship of the substrate 12, the backgate electrode 18, and the insulating overlay 20. The preferred fabrication approach has been selected because of its ease in maintaining the desired structural and epitaxial relationship between these elements and because of its compatibility with existing semiconductor fabrication technology.

The wafer base 10 also preferably includes a backgate contact 22 extending downwardly from the upper surface of the wafer base 10 to contact the backgate electrode 18. The backgate contact 22 provides a front addressable means of applying a voltage to the backgate electrode 18.

The wafer base 10 may be fabricated as a single continuous backgate electrode layer 18 and insulating overlay 20, with electrical contact to the backgate electrode 18 supplied by a single backgate contact 22. Alternatively, multiple, side-by-side, electrically isolated islands 24 may be prepared, each island having its own backgate electrode 18, insulating overlay 20, and backgate contact 22. FIG. 1 illustrates this embodiment, with an independent, electrically isolated island 24a having a separate backgate electrode 18a, insulating overlay 20a, and backgate contact 22a. With this approach, one or a combination of semiconductor devices may be fabricated on top of each island, so that the devices on each island 24 can be independently biased by application of varying electrical potentials to the individual backgate contacts 22 and 22a.

The wafer base 10 is typically not utilized in the form previously described in integrated circuitry, but instead active devices are fabricated on top of and overlying the wafer base 10. The wafer base 10 is operable in its intended use with a wide variety of overlaid semiconductor devices, but the presently preferred overlaid device is a MOS device. FIG. 2 illustrates a wafer base 10 having overlaid MOS devices 26, each comprising an opposed dual gated device of particular value in radiation hardened integrated circuits. Operation of this structure is most readily described and understood in terms of its inter-relationship to the overlaid semiconductor device, and such operation will be described next in relation to the preferred MOS device. However, the invention is not so limited to this particular type of MOS overlaid device, or to the opposed dual gated structure formed thereby.

Referring again to FIG. 1, formation of the backgate electrode 18 and the insulating overlay 20 in the silicon epitaxial layer 14 usually leaves a thin silicon upper layer 28 or 28a, typically about 0.1 to 0.2 micrometers thick. This silicon upper layer 28 is preferably partially removed prior to semiconductor device fabrication, so that the device may be fabricated on an uncontaminated, clean, upper surface of the wafer base 10. Removal of the surface region of the silicon upper layer 28 may be accomplished by techniques well-known in the art, such as etching with hydrochloric acid or plasma cleaning. A fresh layer of silicon, herein termed the silicon device layer 30, may then be deposited over the insulating overlay 20 to increase the thickness of the upper silicon layer.

FIG. 2 illustrates N-channel and P-channel MOSFETS arranged in a side-by-side fashion on the wafer base 10. The following description relates specifically to the N-channel MOSFET, but the principles are applicable to the P-channel MOSFET, except as will be described.

Referring to FIG. 2, in the preferred embodiment the N-channel MOS device 26 is overlaid on the wafer base 10, and is preferably formed by conventional implantation and masking techniques known in the art. The MOS device 26 includes an N+ source 32, an N+ drain 34, and a P− body 36 separating the source 32 and the drain 34. A gate oxide layer 40 overlays the P− body 36, and allows control of the drain current flowing from the source 32 to the drain 34 by application of a gate voltage $V_G$ to the gate oxide layer 40. Conventional metallized contacts are provided to each of the source 32, drain 34, and gate 38.

Figure 3:
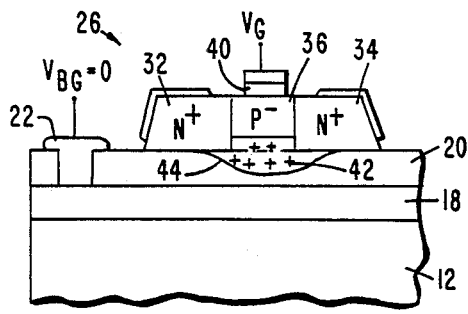
FIG. 3 is a detail of the N-channel MOS device of FIG. 2, illustrating the migration of charge carriers to the gate region of the MOS device, and shorting of the device.

In an ideal MOS device 26, when the gate voltage $V_G$ is zero, the current flowing from the source 32 to the drain 34 will be essentially zero. However, this device characteristic may be altered by the introduction of stray electrical charge carriers 42 into the underlying insulating overlay 20. As illustrated in FIG. 3, the charge carriers 42 created in the insulating overlay 20 can migrate to the area adjacent the interface between the P− body 36 and the insulating overlay 20. These concentrated stray charge carriers 42 can invert the channel region (P− body 36) and thereby form a leakage path 44, whereby current may flow from the source 32 to the drain 34 even in the absence of an applied gate voltage $V_G$. If the concentration of the charge carriers 42 becomes sufficiently great, the leakage path 44 effectively becomes a short between the source 32 and the drain 34, and the entire operation of the MOS device 26 may be disrupted. Excess charge carriers 42 can be a result of inherent defects in the insulating overlay 20, or may be induced externally from the environment or by the introduction of high radiation dosages intended to disrupt operation of the MOS device 26.

Figure 4:
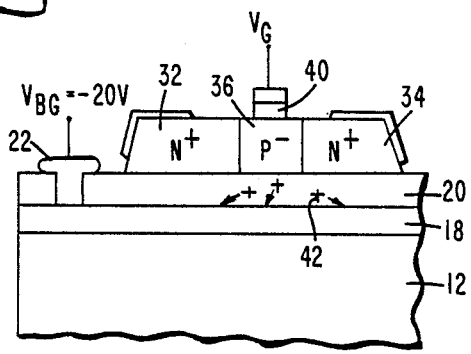
FIG. 4 is a detail view of the N-channel MOS device of FIG. 2, illustrating the effect of a negative bias applied to the backgate electrode.

FIG. 4 illustrates the operation of the wafer base 10 to reduce the concentration of charge carriers 42, thereby eliminating the leakage path 44 in the MOS device 26. Application of a backgate voltage $V_{BG}$ of about −20 volts to the backgate contact 22 similarly biases the backgate electrode 18 to −20 volts. This negative bias on the backgate electrode 18 induces migration of the positive charge carriers 42 from the neighborhood of the interface between the P− body 36 and the insulating overlay 20, downwardly through the insulating overlay 20 and thence to the backgate electrode 18, whereat the charge carriers 42 are neutralized. A steady application of a backgate voltage results in continuous collection of charge carriers 42 as they may be generated in the insulating overlay 20, thence nullifying the deleterious effects of such charge carriers 42 in the operation of the MOS device 26. The backgate voltage $V_{BG}$ may be varied as necessary, or applied in any sequence desired for specific applications.

If the island approach described previously in relation to FIG. 1 is utilized, differing backgate voltages $V_{BG}$ may be applied to different semiconductor devices fabricated on the various islands, as required to achieve satisfactory operation of these various semiconductor devices and subcircuits. The right-hand portion of FIG. 2 illustrates a P-channel MOSFET device 26a, having a P+ source 32a, a P+ drain 34a, and an N− body 36a. The device is fabricated on the etched island 24a by conventional techniques. The principles discussed in relation to FIGS. 3 and 4 for an N-channel device 26 are equally applicable to the P-channel device 26a, except that the polarities are reversed. That is, the stray charge carriers in the P-channel device are negatively charged, and the applied backgate voltage $V_{BG}$ is positive. Thus, the structure disclosed herein allows the simultaneous application of positive and negative backgate bias independently of the desired device or array of devices.

Figure 5:
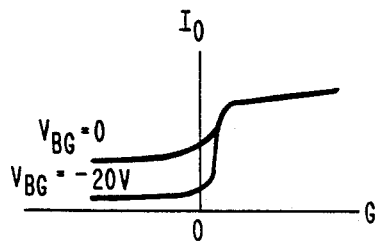
FIG. 5 is a graph illustrating the leakage current of the N-channel MOS device of FIG. 2 as a function of gate voltage, with and without an applied backgate potential.

It will be appreciated that the semiconductor devices illustrated in FIGS. 3 and 4 are themselves novel in large scale integrated circuitry, and constitute three-dimensional opposed dual gated silicon-on-insulator-on-sapphire structures which are particularly useful in radiation hardened integrated circuits. A first gating function for the MOS device 26 (or 26a) is provided by the voltage $V_G$ applied to the conventional gate 38 (or 38a). Additionally, a second gating function is provided by the voltage $V_{BG}$ effectively applied to the opposed face of the P-channel 36 (or N-channel 36a) by biasing the backgate electrode 18 (or 18a). FIG. 5 is a graph illustrating the operating characteristics of the P-channel opposed dual gated semiconductor device. When no backgate voltage $V_{BG}$ is applied, $V_{BG}$ equals zero, and the drain back current is fairly large even for a zero applied gate voltage $V_G$. When a backgate voltage is applied, for example, $V_{BG}$ equal to −20 volts, the drain current curve is displaced downwardly because of the elimination of the leakage path 44, so that the drain current is much less for zero applied gate voltage $V_G$. By this approach, the operating characteristics of the MOS device 26 can be retained with reasonable tolerances even when large numbers of charge carriers 42 have been introduced into the insulating overlay 20 by external radiation. This technique therefore provides a method of radiation hardening the MOS device 26 electrically, rather than by hardening of the device package. The same principles apply to the P-channel device 26a.

The structure of the present invention also provides inherent advantages obtained by hybridizing silicon-on-insulator and silicon-on-sapphire technologies. The structural insulating substrate 12, typically sapphire or spinel, is retained as a secure support for the entire integrated circuit. Conventional island etching procedures may be utilized to define specific regions on the substrate, as in SOS technologies. However, the adverse effect on the performance of semiconductor devices due to the high density of crystal defects at the silicon-sapphire interface is reduced, by introduction of the inherently more perfect silicon-$SiO_2$ or silicon-$Si_3N_4$ interface of SOI technology. Interfacial charging and autodoping problems at the silicon-sapphire interface are also eliminated both physically and electrically by interposing the doped silicon backgate electrode 18 between the substrate 12 and the insulating overlay 20. And, as indicated above, the backgate electrode 18 allows the backgate control of crystal defects in the insulating overlay 20 which can adversely affect the operation of the MOSFET. The application of a backgate voltage $V_{BG}$ is made by a front-addressed contact 22, and by using the island etching approach, different MOSFETs may be differently backgate biased.

Figure 6:
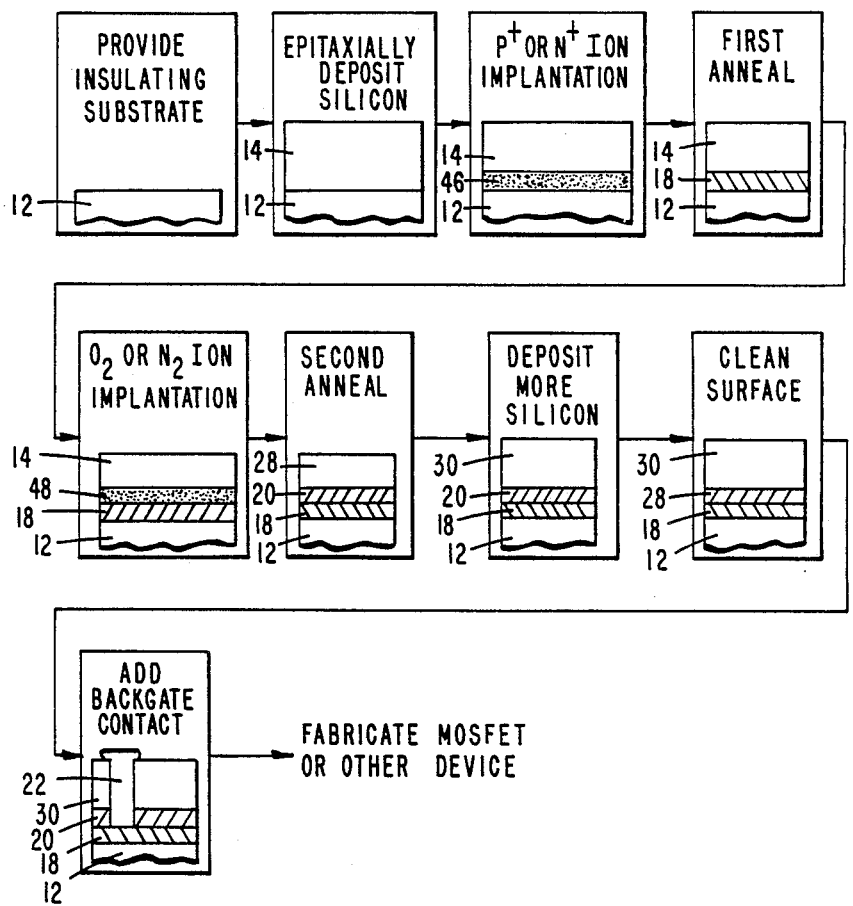
FIG. 6 is a process flow chart for preparing a backgated MOS device.

A preferred process for fabricating an article in accordance with the present invention is illustrated in the process flowchart of FIG. 6. In FIG. 6, the boxes of the schematic process sheet indicate the steps of the fabrication process, and the structure of the resulting device is indicated in the lower portion of each of the boxes. An insulator substrate 12 is provided as the starting material. The substrate is preferably a chip of sapphire or spinel having thickness of about 0.25 to about 0.40 millimeters and a surface orientation of (1102).

A layer 14 of silicon is epitaxially deposited onto the substrate 12, preferably by chemical vapor deposition conducted at about 960° C. with a growth rate of about 2.4 micrometers per minute in an AMT reactor. The combinations of temperature and growth rate are chosen to minimize the defect density in the bulk silicon and at the interface between the silicon epitaxial layer 14 and the substrate 12. Using these growth conditions, a silicon epitaxial layer 14 having a (100) crystallographic orientation is deposited. The thickness of the silicon layer 14 should be at least about 0.3 micrometers, and more preferably is about 0.5 to about 0.6 micrometers thick. This thickness allows proper completion of the subsequent ion implantation steps, and in addition leaves a portion of silicon that may be etched off to remove contamination.

Next, the backgate electrode 18 is formed by the steps of ion implantation and annealing. N+ or P+ ions are implanted into the bottom thickness of the silicon layer 14 immediately adjacent the interface 16 between the silicon epitaxial layer 14 and the substrate 12. The ions are implanted to form the first doped layer 46 having a thickness preferably of about 0.1 micrometers, without causing substantial amorphizing damage to the underlying sapphire or spinel substrate 12, although this requirement is not critical. The preferred N+ dopant is phosphorus, and the preferred P+ dopant is boron. Implantation dosages are typically about $4 \times 10^{15}$ ions per square centimeter for either boron or phosphorus. The energies used are about 350 kV for phosphorus and 200 kV for boron, which energies are sufficient to achieve the desired implantation for the most preferred silicon layer 14 having a thickness of about 0.5 to about 0.6 micrometers. The concentrations achieved are approximately 3 to $5 \times 10^{20}$ carriers/cubic centimeters for phosphorus and boron.

The substrate 12, epitaxial layer 14 and the first doped layer 46 are then annealed to transform the first doped layer 46 to the backgate electrode 18. Annealing is preferably accomplished in flowing nitrogen gas at 850° C. for thirty minutes.

The insulating overlay 20 is next formed by ion implantation and annealing. The insulating overlay 20 is preferably formed of $SiO_2$ or $Si_3N_4$, by annealing a heavily implanted silicon layer. Ions of $O_2^+$ or $N_2^+$ are implanted into the wafer base 10, preferably at a substrate temperature of about 550° C. $O_2^+$ ions are preferably implanted at about 200 kV, and $N_2^+$ ions are preferably implanted at about 350 kV energy. The dose for oxygen is preferably about $1.4 \times 10^{18}$ ions/square centimeter, and the dose for nitrogen is preferably about $7 \times 10^{17}$ ions/square centimeter. The dose rate for both is preferably from about 0.1 to 10 milliamps of beam current, which is sufficiently high to provide substantial beam heating of the region being implanted. External heating may also be provided to form the desired $SiO_2$ or $Si_3N_4$ region while maintaining the overlying single crystal region. Implantation forms a second doped layer 48 having a thickness of from about 0.1 to 0.2 micrometers, immediately adjacent and overlying the backgate electrode 18.

The implanted structure is then annealed a second time to transform the second layer 48 to the insulating overlay 20. The second annealing treatment transforms an $O_2^+$ implanted second doped layer 48 to $SiO_2$, and an $N_2^+$ second doped layer 48 to $Si_3N_4$. Additionally, the second annealing treatment recrystallizes the silicon upper layer 28, which had been damaged by the prior ion implantation. The second annealing treatment is preferably accomplished in an epitaxial reactor under a flowing nitrogen plus hydrogen atmosphere at about 1100° C. for about 2 hours.

At this point, fabrication of the three-dimensional structure is substantially complete, and the wafer base 10 is ready for fabrication of a semiconductor device thereupon and overlying the insulating overlay 20. Fabrication of the semiconductor device may be by any method appropriate for the device, and will vary depending upon the precise device fabricated. The following description deals with the fabrication of the preferred overlying semiconductor device, an opposed dual gated MOSFET having particular utility in a radiation hardened application.

Since fabrication of this preferred dual gated MOSFET requires a greater thickness of silicon to fabricate the device, more silicon is deposited on top of the silicon upper layer 28 to form a silicon device layer 30 having a total thickness of about 0.4 to about 0.5 micrometers. The silicon is deposited by chemical vapor deposition in an AMT reactor, preferably at about 960° C. with a growth rate of about 2.4 micrometers per minute. If any contamination is noted prior to the addition of silicon in this step, the upper surface of the silicon upper layer 28 may be cleaned and possibly partially etched to remove contaminants. This is accomplished by an annealing step in $H_2$ ambient which etches at a slow rate of about 250 Å per hour.

Next, the upper surface of the silicon device layer 30 is cleaned and etched in preparation for fabrication of the MOSFET. The surface is cleaned with an appropriate mixture of ammonium hydroxide, sulfuric acid and hydrogen peroxide, and etched preferably in a 50:50 mixture of hydrofluoric acid and sulfuric acid to remove any surface contaminants. In the etching step, typically about 0.2 micrometers of deposited silicon is removed, leaving a thickness of the silicon device layer 30 of about 0.2 to about 0.3 micrometers. The MOSFET may then be fabricated by any conventional technique such as etching and doping, as is well-known to those skilled in the art.

The backgate contact 22 is fabricated into the wafer base 10 or completed device at any appropriate stage of processing. FIG. 6 illustrates the addition of the backgate contact after the surface cleaning step but prior to the fabrication of the MOSFET. To form the backgate contact 22, a suitably defined hole is etched downwardly through all layers residing above the backgate electrode 18, which in the case of the illustration include the silicon device layer 30 and the insulating overlay 20. Etching may be accomplished using hydrofluoric acid or a plasma etch, for example. A metallic contact may be established by filling the hole with a metal such as aluminum or with suitably doped polysilicon or with a silicide layer to provide a low resistance path.

Although the preferred fabrication procedure involves the multiple doping by ion implantation and annealing of an epitaxially deposited silicon layer, the apparatus and device of the invention are not limited to this fabrication approach.

As can now be appreciated, the present approach yields a three-dimensional structure, specialized devices, and a process for their preparation having unique structure and features not otherwise available. A wafer base includes a backgate electrode which may be used to induce migration of unwanted charge carriers from the gate region of an overlying semiconductor device. Removal of these unwanted charge carriers prevents undesired modification of device characteristics, or destruction of the device, by the effects of external radiation directed against the device to damage it. The approach involves vertical hybridization of SOI and SOS technologies, and avoids many of their problems while at the same time retaining their benefits and adding new features not heretofore available. Although a particular embodiment of the invention has been described for purposes of illustration, various modifications may be made without departing from the spirit and scope of the invention. Accordingly, the present invention is not to be limited except as by the appended claims.

What is claimed is:

1. A semiconductor integrated circuit device, comprising:

an insulating substrate;
a first backgate electrode made of a layer of doped semiconductor material epitaxially related to said insulating substrate formed over a portion of said insulating substrate;
a second backgate electrode made of a layer of doped semiconductor material epitaxially related to said insulating substrate formed over another portion of said insulating substrate;
an insulating overlay made of nonconductive material overlying and epitaxially related to said first and second backgate electrodes;
a first gated semiconductor device including source, channel and drain regions overlying said insulating overlay and first backgate electrode wherein the extent of said first backgate electrode along said insulating overlay is greater than the lateral extent of the source, channel and drain regions of said first semiconductor device;
a second gated semiconductor device including source, channel and drain regions overlying said insulating overlay and second backgate electrode wherein the extent of said second backgate electrode along said insulating overlay is greater than the lateral extent of the source, channel and drain regions of said second semiconductor device; and
separate means for electrically biasing said first and second backgate electrodes independently.

2. The device of claim 1, wherein said substrate is selected from the group consisting of sapphire and spinel.

3. The device of claim 1, wherein said first and second backgate electrodes and said insulating overlay are formed in a single piece of silicon epitaxially related to said insulating substrate, and wherein said backgate electrodes and said insulating overlay are doped with different dopants.

4. The device of claim 1, wherein said first and second backgate electrodes are doped with a dopant selected from the group consisting of boron and phosphorus.

5. The device of claim 1, wherein said insulating overlay is doped with a dopant selected from the group consisting of oxygen and nitrogen.

6. The device of claim 1, wherein said first and second gated semiconductor devices are MOSFETs.

7. An integrated semiconductor circuit device, comprising:
an insulating substrate selected from the group consisting of sapphire and spinel;
a first backgate electrode made of a layer of semiconductor material of N+ or P+ conductivity, overlying and epitaxially related to said insulating substrate;
a second backgate electrode made of a layer of semiconductor material of N+ or P+ conductivity overlying and epitaxially related to said insulating substrate;
a layer of insulating material overlying said first and second backgate electrodes;
a first gated semiconductor device having source, drain and channel regions overlying said insulating layer and first backgate electrode, wherein the extent of said first backgate electrode along said insulating layer is greater than the width of said source, drain and channel regions of said first gated semiconductor device;
a second gated semiconductor device having source, drain and channel regions overlying said insulating layer and second backgate electrode, wherein the extent of said second backgate electrode along said insulating layer is greater than the width of said source, drain and channel regions of said second gated semiconductor device;
a first electrical backgate contact to said first backgate electrode, whereby said first backgate electrode may be electrically biased to act as a second gate for said first semiconductor gated device; and
a second electrical backgate contact to said second backgate electrode, whereby said second backgate electrode may be electrically biased to act as a second gate for said second gated semiconductor device.

8. The device of claim 7, wherein said gated semiconductor devices are MOS semiconductor devices.

9. The device of claim 7, wherein said device contains at least two silicon layers arranged in a side-by-side island fashion, each of said silicon layers including its own separate electrical backgate contact with an insulating overlay so that each of said backgate contacts may be electrically biased independently, and each of said two silicon layers has at least one overlying gated semiconductor device.

10. The device of claim 7, wherein said substrate has a thickness of about 0.25 millimeters, said first and second backgate electrodes are about 0.2 micrometers thick, and said insulating layer is about 0.1 micrometers thick.

11. An integrated semiconductor circuit device, comprising,
an insulating substrate;
a plurality of backgate electrodes made of highly doped semiconductor material overlying and epitaxially related to said insulating substrate;
a layer of insulating material overlying and epitaxially related to said plurality of backgate electrodes;
a plurality of gated semiconductor devices having source, channel and drain regions overlying said insulating layer, respective one of said gated semiconductor devices overlying respective ones of said backgate electrodes, wherein the extent of respective backgate electrodes along said insulating layer is greater than the width of their respective overlying gated semiconductor device source, channel and drain regions; and
separate means for biasing each backgate electrode independently.

* * * * *